United States Patent
Maeda et al.

(10) Patent No.: US 11,685,843 B2
(45) Date of Patent: Jun. 27, 2023

(54) LAMINATE FOR BATTERY

(71) Applicant: MITSUI CHEMICALS, INC., Tokyo (JP)

(72) Inventors: Takahiro Maeda, Dusseldorf (DE); Yoshiyuki Ogawa, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 965 days.

(21) Appl. No.: 16/488,432

(22) PCT Filed: Mar. 1, 2018

(86) PCT No.: PCT/JP2018/007746
§ 371 (c)(1),
(2) Date: Aug. 23, 2019

(87) PCT Pub. No.: WO2018/180165
PCT Pub. Date: Oct. 4, 2018

(65) Prior Publication Data
US 2020/0002577 A1  Jan. 2, 2020

(30) Foreign Application Priority Data

Mar. 29, 2017  (JP) ............................. JP2017-065000

(51) Int. Cl.

| | |
|---|---|
| *C09J 7/38* | (2018.01) |
| *H01M 8/0221* | (2016.01) |
| *H01M 8/0228* | (2016.01) |
| *H01M 8/0284* | (2016.01) |
| *H01M 10/0525* | (2010.01) |
| *C09J 7/28* | (2018.01) |
| *C09J 123/16* | (2006.01) |
| *H01M 50/121* | (2021.01) |
| *H01M 50/119* | (2021.01) |
| *H01M 50/131* | (2021.01) |
| *H01M 50/124* | (2021.01) |
| *H01G 9/20* | (2006.01) |
| *H01L 31/048* | (2014.01) |
| *H01M 50/489* | (2021.01) |
| *H01M 50/193* | (2021.01) |
| *H01M 50/417* | (2021.01) |

(52) U.S. Cl.
CPC ................ *C09J 7/381* (2018.01); *C09J 7/28* (2018.01); *C09J 123/16* (2013.01); *H01M 8/0221* (2013.01); *H01M 8/0228* (2013.01); *H01M 8/0284* (2013.01); *H01M 10/0525* (2013.01); *H01M 50/119* (2021.01); *H01M 50/121* (2021.01); *H01M 50/124* (2021.01); *H01M 50/131* (2021.01); *C09J 2203/33* (2013.01); *C09J 2301/312* (2020.08); *C09J 2301/414* (2020.08); *C09J 2400/163* (2013.01); *C09J 2423/10* (2013.01); *H01G 9/20* (2013.01); *H01L 31/0481* (2013.01); *H01M 50/193* (2021.01); *H01M 50/417* (2021.01); *H01M 50/489* (2021.01)

(58) Field of Classification Search
CPC ... C09J 7/381; C09J 7/28; C09J 123/16; C09J 2203/33; C09J 2301/312; C09J 2301/414; C09J 2400/163; C09J 2423/10; C09J 7/35; C09J 2031/304; C09J 2423/00; C09J 133/14; H01M 50/417; H01M 8/0221; H01M 8/0228; H01M 8/0284; H01M 10/0525
See application file for complete search history.

(56) References Cited

U.S. PATENT DOCUMENTS

| | | | |
|---|---|---|---|
| 5,695,838 A | 12/1997 | Tanaka et al. | |
| 7,989,083 B2 * | 8/2011 | Morikawa | C08L 51/006 525/74 |
| 8,563,138 B2 | 10/2013 | Yasui et al. | |
| 9,109,143 B2 | 8/2015 | Tse et al. | |
| 9,556,345 B2 | 1/2017 | Oestreich et al. | |
| 9,605,186 B2 | 3/2017 | Tse | |
| 9,803,113 B2 | 10/2017 | Tse | |
| 10,305,069 B2 | 5/2019 | Ogihara et al. | |
| 2006/0160941 A1 * | 7/2006 | Kanzaki | C08L 53/00 524/451 |
| 2010/0173168 A1 | 7/2010 | Yasui et al. | |
| 2013/0160676 A1 | 6/2013 | Oestreich et al. | |
| 2013/0225752 A1 | 8/2013 | Tse et al. | |
| 2015/0166850 A1 | 6/2015 | Tse | |
| 2015/0225624 A1 | 8/2015 | Tse | |
| 2015/0291859 A1 * | 10/2015 | Takamura | H01M 10/052 429/233 |
| 2016/0197318 A1 | 7/2016 | Yamashita et al. | |
| 2018/0076421 A1 | 3/2018 | Ogihara et al. | |
| 2022/0195142 A1 * | 6/2022 | Kimura | C08K 5/14 |

FOREIGN PATENT DOCUMENTS

| | | | | |
|---|---|---|---|---|
| CN | 105518897 A | | 4/2016 | |
| EP | 1887026 B1 * | 7/2017 | ............ | C08F 255/00 |

(Continued)

OTHER PUBLICATIONS

Prime Polypro Datasheet from Prime Polymer http://www.primepolymer.co.jp/english/product/pp/primepolypro.html (published Jul. 2021, accessed Jul. 29, 2022) (Year: 2021).*

(Continued)

*Primary Examiner* — Scott R. Walshon
(74) *Attorney, Agent, or Firm* — Foley & Lardner LLP

(57) ABSTRACT

A laminate for a battery with a polypropylene adhesive layer and a metal substrate layer: (1) the adhesive includes 40-94 wt % of a propylene copolymer (A), 3-30 wt % of a butene-containing copolymer (B), 3-30 wt % of an ethylene-α-olefin copolymer (C) ((A), (B), and (C) is 100 wt %), (2) the copolymer (A) has a melting point of 130° C. or more measured with a differential scanning calorimeter, and a total proportion of a structural unit derived from ethylene is 4-25 mol % relative to 100 mol % of a total structural units forming all the copolymers (A) contained in the adhesive, (3) the copolymer (B) includes less than 1 mol % of a structural unit derived from ethylene, and has a melting point of 100° C. or less measured with a differential scanning calorimeter, and (4) the copolymer (C) includes 50-99 mol % of a structural unit derived from ethylene.

12 Claims, No Drawings

(56) References Cited

FOREIGN PATENT DOCUMENTS

| | | |
|---|---|---|
| JP | H04-300933 A | 10/1992 |
| JP | H09-111069 A | 4/1997 |
| JP | 2013-540846 A | 11/2013 |
| JP | 2013-540867 A | 11/2013 |
| JP | 2016-502579 A | 1/2016 |
| WO | WO-2007/086425 A | 8/2007 |
| WO | WO-2016/125684 A1 | 8/2016 |
| WO | WO-2017017136 A1 * | 2/2017 ............. C08F 10/04 |

OTHER PUBLICATIONS

Tafmer XM datasheet from Mitusi Chemicals at https://jp.mitsuichemicals.com/en/special/tafmer/assets/pdf/propylenebased_wirecable_XM.pdf (accessed Jul. 29, 2022) (Year: 2022).*

Office Action dated Sep. 18, 2020 for corresponding Chinese Patent Application No. 201880012073.9.

\* cited by examiner

LAMINATE FOR BATTERY

RELATED APPLICATIONS

The present application claims priority under 37 U.S.C. § 371 to International Patent Application No. PCT/JP2018/007746, filed Mar. 1, 2018, which claims priority to and the benefit of Japanese Patent Application No. 2017-065000, filed on Mar. 29, 2017. The contents of these applications are hereby incorporated by reference in their entireties.

TECHNICAL FIELD

The present invention relates to laminates for batteries, and relates to a laminate including a novel adhesive layer and a metal substrate layer.

BACKGROUND ART

In the related art, polypropylene is widely used as a thermoplastic molding material having, for example, high rigidity, heat resistance, and transparency. Polypropylene, which is a nonpolar material, has poor adhesiveness to polar materials, such as ethylene-vinyl alcohol copolymers, and metals, for example. To improve the adhesiveness, techniques of modifying polypropylene with an unsaturated carboxylic acid or a derivative thereof are known. In addition, polypropylene has poor flexibility. For this reason, when used as adhesives, polypropylene is usually compounded with a soft rubber component.

Polypropylene adhesives are proposed whose adhesiveness is improved by compounding polypropylene with a soft rubber component (Patent Literatures 1 and 2). Furthermore, a polypropylene adhesive is proposed whose adhesiveness after thermal history is also improved by adding a propylene-ethylene copolymer optimized as a soft rubber component (Patent Literature 3).

Citation List

Patent Literature

Patent Literature 1: JP-A-H9-111069
Patent Literature 2: JP-A-H4-300933
Patent Literature 3: WO 2007/086425

SUMMARY OF INVENTION

Technical Problem

Applications of the polypropylene adhesives are expanded to those under high temperature atmospheres, such as those to electronic information materials. The adhesives are required to have a sufficient adhesive force to metals even under high temperature atmospheres.

Examples of specific applications include food product packaging materials, construction materials, electrode protective members of solar batteries, packaging materials and tab lead materials of lithium ion batteries, and sealing materials of fuel battery cells.

Among these, for example, the lithium ion batteries have a mechanism to shut down near a temperature of 120° C., which is the melting point of the polyethylene separator. The polyethylene separator is required to keep a high adhesive force even at a high temperature close to a temperature near 120° C. to further enhance the safety.

Although the traditional techniques improve the flexibility of propylene adhesive layers and thus the adhesive force thereof at normal temperature, any configuration has not been found in which a high adhesive force under high temperature atmospheres, in contrast, is provided, leading to a necessity of an additional system such that the temperature of the battery does not increase beyond the heat-resistant temperature of the resin.

One embodiment of the present invention provides a laminate for a battery having high adhesiveness, particularly, high adhesiveness even under high temperature.

Solution to Problem

As a result of extensive research to solve the above problem, the present inventor has found that the above object can be achieved by devising the composition of a propylene adhesive layer, and has completed the present invention.

Namely, one embodiment of the present invention relates to a laminate for a battery comprising a polypropylene adhesive layer (I) and a metal substrate layer (II), the polypropylene adhesive layer (I) satisfying at least the following requirements (1) to (4).

(1) The adhesive comprises:
40 to 94% by weight of a propylene copolymer (A);
3 to 30% by weight of a butene-containing copolymer (B); and
3 to 30% by weight of an ethylene-α-olefin copolymer (C) (where the total of the copolymers (A), (B), and (C) is 100% by weight).

(2) The copolymer (A) is a polymer having a melting point (TmA) of 130° C. or more measured with a differential scanning calorimeter (DSC), and
the total proportion of a structural unit derived from ethylene is 4 to 25 mol % relative to 100 mol % of the total structural units forming all the copolymers (A) contained in the adhesive.

(3) The copolymer (B) includes less than 1 mol % of a structural unit derived from ethylene, and
has a melting point (TmB) of 100° C. or less measured with DSC.

(4) The copolymer (C) includes 50 to 99 mol % of a structural unit derived from ethylene.

Advantageous Effects of Invention

The laminate for a battery according to one embodiment of the present invention has high adhesiveness to metal substrate layers under normal temperature and high adhesiveness under high temperature atmosphere. For this reason, use of the laminate enables expansion of the upper limit temperature in use of batteries with safety, simplifying the entire configurations of the batteries.

DESCRIPTION OF EMBODIMENTS

<<Laminate for Battery>>

The laminate for a battery according to one embodiment of the present invention (hereinafter, also referred to as "the present laminate") is a laminate for a battery, comprising:
a polypropylene adhesive layer (I) which satisfies at least the following requirements (1) to (4) and a metal substrate layer (II).
(1) The adhesive comprises:
40 to 94% by weight of a propylene copolymer (A);
3 to 30% by weight of a butene-containing copolymer (B); and 3 to 30% by weight of an ethylene-α-olefin copolymer (C) (where the total of the copolymers (A), (B), and (C) is 100% by weight).

(2) The copolymer (A) is a polymer having a melting point (TmA) of 130° C. or more measured with a differential scanning calorimeter (DSC), and the total proportion of a structural unit derived from ethylene is 4 to 25 mol % relative to 100 mol % of the total structural units forming all the copolymers (A) contained in the adhesive.

(3) The copolymer (B) includes less than 1 mol % of a structural unit derived from ethylene, and has a melting point (TmB) of 100° C. or less measured with DSC.

(4) The copolymer (C) includes 50 to 99 mol % of a structural unit derived from ethylene.

The adhesive may contain one or more copolymers (A). The adhesive may contain one or more copolymers (B). The adhesive may contain one or more copolymers (C).

<Polypropylene Adhesive>

The polypropylene adhesive comprises 40 to 94% by weight of a propylene copolymer (A), 3 to 30% by weight of a butene-containing copolymer (B), 3 to 30% by weight of an ethylene-α-olefin copolymer (C) (where the total of the copolymers (A), (B), and (C) is 100% by weight).

The polypropylene adhesive contains predetermined amounts of these copolymers. Therefore, the resulting adhesive layer prepared from the adhesive has high adhesiveness to the metal substrate layer under normal temperature and high adhesiveness thereto under high temperature atmosphere in a good balance.

[Propylene Copolymer (A)]

The melting point (TmA) of the propylene copolymer (A) measured with a differential scanning calorimeter (DSC) is not particularly limited as long as it is 130° C. or more.

TmA is preferably 130 to 160° C.

TmA within this range can facilitate the obtaining of a laminate having high adhesiveness under high temperature atmosphere.

TmA can be measured, specifically, by a method described in Examples.

The copolymer (A) is not particularly limited as long as it is a copolymer including a structural unit derived from propylene and having a TmA of 130° C. or more. Examples thereof include propylene-α-olefin copolymers. The copolymer (A) is a polymer different from the copolymer (C) and the modified polyolefin (D) described below.

The copolymer (A) may also be a copolymer prepared using a compound copolymerizable with propylene or α-olefin in synthesis of these copolymers.

The α-olefin is preferably α-olefins having 2 or 4 to 20 carbon atoms, more preferably α-olefins having 2 or 4 to 10 carbon atoms. These α-olefins may be used singly or two or more thereof may be used.

The content of the structural unit derived from the α-olefin in the propylene-α-olefin copolymer is preferably 1 to 55 mol %, more preferably 2 to 50 mol %, particularly preferably 2 to 45 mol %.

The copolymer (A) preferably contains a propylene-ethylene-α-olefin copolymer to facilitate the obtaining of an adhesive layer having, for example, high adhesiveness to the metal substrate layer under normal temperature and that under high temperature atmosphere in a good balance.

The α-olefin is α-olefins having 4 or more carbon atoms, more preferably α-olefins having 4 to 20 carbon atoms. To facilitate the obtaining of an adhesive layer having, for example, high adhesiveness to the metal substrate layer under normal temperature and that under high temperature atmosphere in a good balance, more preferred are α-olefins having 4 to 10 carbon atoms, and particularly preferred is 1-butene. These α-olefins may be used singly or two or more thereof may be used.

The content of the structural unit derived from propylene in the propylene-ethylene-α-olefin copolymer is preferably 45 to 90 mol %, more preferably 50 to 85 mol %, particularly preferably 55 to 80 mol %.

The content of the structural unit derived from ethylene in the propylene-ethylene-α-olefin copolymer is preferably 5 to 25 mol %, more preferably 10 to 22 mol %, particularly preferably 10 to 20 mol %.

The content of the structural unit derived from α-olefin in the propylene-ethylene-α-olefin copolymer is preferably 1 to 30 mol %, more preferably 5 to 28 mol %, particularly preferably 10 to 28 mol %.

The total proportion of the structural unit derived from ethylene (hereinafter, also referred to as "ethylene content Z") relative to 100 mol % of the total structural units forming all the copolymers (A) contained in the adhesive is 4 to 25 mol %, preferably 5 to 20 mol %, more preferably 5 to 15 mol %.

An ethylene content Z within this range can facilitate the obtaining of an adhesive layer having high adhesiveness to the metal substrate layer under normal temperature and that under high temperature atmosphere in a good balance.

The ethylene content Z refers to the proportion of the structural unit derived from ethylene in the copolymer (A) if the adhesive contains one copolymer (A).

In other words, if one copolymer (A) is used as a raw material for the adhesive, the copolymer used is a copolymer containing 4 to 25 mol % of the structural unit derived from ethylene in the copolymer. A preferred range of the content of the structural unit derived from ethylene in the copolymer is the same range as that of the ethylene content Z.

For example, if the adhesive contains two copolymers (A) (the adhesive contains a % by weight of copolymer A-1 [proportion of the structural unit derived from ethylene in the copolymer A-1: m mol %], and b % by weight of copolymer A-2 [proportion of the structural unit derived from ethylene in the copolymer A-2: n mol %]), the ethylene content Z (mol %) is calculated from the following expression:

$$\text{ethylene content } Z = m \times a/(a+b) + n \times b/(a+b)$$

If two copolymers (A) are used as raw materials for the adhesive, the copolymers used may be copolymers each including 4 to 25 mol % of the structural unit derived from ethylene in the copolymer, or copolymers including the structural unit derived from ethylene in the copolymer in an amount out of 4 to 25 mol % may be used.

If the copolymer including the structural unit derived from ethylene in the copolymer in an amount out of 4 to 25 mol % is used, the proportion of the copolymer (A) used may be controlled such that the ethylene content Z calculated from the expression above is 4 to 25 mol %, or, as the copolymer (A), a copolymer (A) including a predetermined content of the structural unit derived from ethylene may be used such that the ethylene content Z calculated from the expression above is 4 to 25 mol %.

Also in the case where three or more copolymers (A) are contained in the adhesive, the ethylene content Z is calculated in the same manner as in the case where the two copolymers (A) are used.

The copolymer (A) has a melt flow rate (MFR) [ASTM D 1238 (temperature: 230° C., load: 2.16 kg)] of preferably 0.1 to 50 g/10 min, more preferably 0.5 to 10 g/10 min.

An MFR within this range can provide an adhesive layer having a good balance between the flexibility and the mechanical strength and having a higher adhesive force.

The copolymer (A) has a density of preferably 0.86 to 0.91 g/cm$^3$, more preferably 0.87 to 0.91 g/cm$^3$ measured based on JIS K7112.

The copolymer (A) has a molecular weight distribution (Mw/Mn) of preferably 1.5 to 5.0, more preferably 1.8 to 4.0.

The molecular weight distribution can be measured, specifically, by the method described in Examples below.

The method of preparing the copolymer (A) is not particularly limited and the copolymer (A) can be prepared by a well-known method using a well-known catalyst such as a Ziegler-Natta catalyst or a metallocene catalyst. The copolymer that satisfies the formability and provides a laminate having a strength withstanding the use is preferable, and the stereoregularity and molecular weight are not particularly limited in the range not impairing the advantageous effects of the invention.

A commercially available resin may also be used as it is.

The content of the copolymer (A) in the polypropylene adhesive is 40 to 94% by weight, preferably 50 to 85% by weight, more preferably 55 to 80% by weight relative to 100% by weight of the total of the copolymers (A), (B), and (C).

A content of the copolymer (A) within this range can facilitate the obtaining of an adhesive layer having high adhesiveness to the metal substrate layer under normal temperature and that under high temperature atmosphere in a good balance.

The content of the propylene-ethylene-α-olefin copolymer relative to 100% by weight of the copolymer (A) contained in the adhesive is preferably 10% by weight or more, more preferably 10 to 80% by weight, particularly preferably 20 to 70% by weight.

A content of the propylene-ethylene-α-olefin copolymer within this range can facilitate the obtaining of an adhesive layer having high adhesiveness to the metal substrate layer under normal temperature and that under high temperature atmosphere in a good balance.

[Butene-Containing Copolymer (B)]

The butene-containing copolymer (B) is a copolymer including a structural unit derived from butene, where the content of the structural unit derived from ethylene is less than 1 mol %. Preferred is a propylene-butene copolymer. The copolymer (B) is a polymer different from the modified polyolefin (D) described below.

The content of the structural unit derived from butene in the copolymer (B) is preferably 10 to 30 mol %, more preferably 12 to 28 mol %.

The content of the structural unit derived from propylene in the copolymer (B) is preferably 70 to 90 mol %, more preferably 72 to 88 mol %.

The copolymer (B) has a melting point (TmB) of 100° C. or less, more preferably 60 to 100° C. measured with DSC.

A TmB within this range can facilitate the obtaining of a laminate having high adhesiveness under normal temperature and that under high temperature atmosphere in a good balance.

TmB can be measured, specifically, by the method described in Examples below.

The copolymer (B) has an MFR [ASTM D 1238(temperature: 230° C., load: 2.16 kg)] of preferably 0.1 to 50 g/10 min, more preferably 0.5 to 10 g/10 min.

An MFR within this range can provide an adhesive layer having a good balance between the flexibility and the mechanical strength and having a higher adhesive force.

The copolymer (B) has a density of preferably 0.86 to 0.90 g/cm$^3$, more preferably 0.87 to 0.90 g/cm$^3$ measured based on JIS K7112.

The molecular weight distribution (Mw/Mn) of the copolymer (B) is preferably 1.5 to 5.0, more preferably 1.8 to 4.0.

The method of preparing the copolymer (B) is not particularly limited and the copolymer (B) can be prepared by a well-known method using a well-known catalyst such as a Ziegler-Natta catalyst or a metallocene catalyst. The copolymer that satisfies the formability and provide a laminate having a strength withstanding the use is preferable, and the stereoregularity and molecular weight are not particularly limited in the range not impairing the advantageous effects of the invention.

A commercially available resin may also be used as it is.

The content of the copolymer (B) in the polypropylene adhesive is 3 to 30% by weight, preferably 5 to 30% by weight, more preferably 5 to 25% by weight relative to 100% by weight of the total of the copolymers (A), (B), and (C).

A content of the copolymer (B) within this range can facilitate the obtaining of an adhesive layer having high adhesiveness to the metal substrate layer under normal temperature and that under high temperature atmosphere in a good balance.

[Ethylene-α-Olefin Copolymer (C)]

The ethylene-α-olefin copolymer (C) is not particularly limited as long as it is a copolymer including 50 to 99 mol % of the structural unit derived from ethylene. The copolymer (C) is a polymer different from the modified polyolefin (D) described below.

The content of the structural unit derived from ethylene in the copolymer (C) is preferably 60 to 95 mol %, more preferably 70 to 90 mol %.

As the α-olefin, preferred are α-olefins having 3 to 20 carbon atoms, more preferred are α-olefins having 3 to 10 carbon atoms, and particularly preferred is propylene or butene. The content of the structural unit derived from α-olefin in the copolymer (C) is preferably 1 to 50 mol %, more preferably 5 to 40 mol %, particularly preferably 10 to 30 mol %.

These α-olefins may be used singly or two or more thereof may be used.

The copolymer (C) has an MFR [ASTM D 1238 (temperature: 230° C., load: 2.16 kg)] of preferably 0.1 to 70 g/10 min, more preferably 0.5 to 20 g/10 min.

An MFR within this range can provide an adhesive layer having a good balance between the flexibility and the mechanical strength and having a higher adhesive force.

The copolymer (C) has a density of preferably 0.85 to 0.90 g/cm$^3$, more preferably 0.86 to 0.89 g/cm$^3$ measured based on JIS K7112.

The copolymer (C) has a molecular weight distribution (Mw/Mn) of preferably 1.5 to 5.0, more preferably 1.8 to 4.0.

The method of preparing the copolymer (C) is not particularly limited and the copolymer (C) can be prepared by a well-known method using a well-known catalyst such as a Ziegler-Natta catalyst or a metallocene catalyst. The copolymer that satisfies the formability and provides a laminate having a strength withstanding the use is preferable, and the stereoregularity and molecular weight are not particularly limited in the range not impairing the advantageous effects of the invention.

A commercially available resin may also be used as it is.

The content of the copolymer (C) in the polypropylene adhesive is 3 to 30% by weight, preferably 5 to 28% by weight, more preferably 10 to 25% by weight relative to 100% by weight of the total of the copolymers (A), (B), and (C).

The content of the copolymer (C) within this range can facilitate the obtaining of an adhesive layer having high adhesiveness to the metal substrate layer under normal temperature and that under high temperature atmosphere in a good balance.

[Modified Polyolefin (D)]

The polypropylene adhesive preferably contains a modified polyolefin (D) modified with an unsaturated carboxylic acid and/or a derivative thereof to facilitate the obtaining of a laminate having high adhesiveness between the resulting adhesive layer and the metal substrate layer.

The adhesive may contain one or more modified polyolefins (D).

The modified polyolefin (D) is prepared by modifying a polyolefin (hereinafter, also referred to as "trunk polymer". The trunk polymer is also a structural unit excluding structural units derived from the unsaturated carboxylic acid and a derivative thereof in the modified polyolefin (D)) with an unsaturated carboxylic acid and/or a derivative thereof, and contains a structural unit derived from the unsaturated carboxylic acid and/or a derivative thereof.

In the modified polyolefin (D), two or more trunk polymers may be used.

Examples of the trunk polymer include polypropylene (d1), ethylene-propylene-α-olefin copolymer (d2), and ethylene-α-olefin copolymer (d3).

The polypropylene (d1) is a homopolymer of propylene and/or a propylene-α-olefin copolymer, for example. The polypropylene (d1) may contain several different isotactic polypropylenes.

The α-olefin is not particularly limited and preferable examples thereof include ethylene and α-olefins having 4 to 20 carbon atoms. These α-olefins may be used singly or two or more thereof may be used. Preferred α-olefins are ethylene and α-olefins having 4 to 10 carbon atoms. Among these, more suitable are ethylene and α-olefins having 4 to 8 carbon atoms. Here, the content of the structural unit derived from propylene in the propylene-α-olefin copolymer is at least 50 mol % or more and less than 100 mol %.

The method of preparing the polypropylene (d1) is not particularly limited, and examples thereof include well-known methods using well-known catalysts such as Ziegler-Natta catalysts and metallocene catalysts.

Preferred polypropylene (d1) is a crystalline polymer. In the case of a copolymer, the polypropylene (d1) may be a random copolymer, or may be a block copolymer. The copolymer that satisfies the formability and provides a laminate having a strength withstanding the use is preferable, and the stereoregularity and molecular weight are not particularly limited in the range not impairing the advantageous effects of the invention.

A commercially available resin may also be used as it is.

The ethylene-propylene-α-olefin copolymer (d2) includes 45 to 89 mol % of a structural unit derived from propylene, 10 to 25 mol % of a structural unit derived from ethylene, and 1 to 30 mol % of a structural unit derived from α-olefin having 4 to 20 carbon atoms, for example.

As the α-olefin, preferred are α-olefins having 4 to 10 carbon atoms. These α-olefins may be used singly or two or more thereof may be used.

In the copolymer (d2), the content of the structural unit derived from ethylene is preferably 10 to 22 mol %, more preferably 10 to 20 mol %. The content of the structural unit derived from propylene is preferably 50 to 85 mol %, more preferably 55 to 80 mol %. The content of the structural unit derived from the α-olefin is preferably 5 to 28 mol %, more preferably 10 to 28 mol %.

The method of preparing the copolymer (d2) is not particularly limited and examples thereof include well-known methods using well-known catalysts such as Ziegler-Natta catalysts and metallocene catalysts.

The copolymer (d2) may be a random copolymer, or may be a block copolymer. The copolymer that satisfies the formability and provides a laminate having a strength withstanding the use is preferable, and the stereoregularity and molecular weight are not particularly limited in the range not impairing the advantageous effects of the invention.

A commercially available resin may also be used as it is.

The ethylene-α-olefin copolymer (d3) preferably includes 50 to 99 mol % of the structural unit derived from ethylene, and 1 to 50 mol % of the structural units derived from α-olefins having 3 to 20 carbon atoms.

As the α-olefin, more suitable are α-olefins having 3 to 10 carbon atoms. These α-olefins may be used singly or two or more thereof may be used.

In the copolymer (d3), the content of the structural unit derived from ethylene is more preferably 55 to 98 mol %, particularly preferably 60 to 95 mol %. The content of the structural unit derived from the α-olefin is more preferably 2 to 45 mol %, particularly preferably 5 to 40 mol %.

The method of preparing the copolymer (d3) is not particularly limited and examples thereof include well-known methods using well-known catalysts such as Ziegler-Natta catalysts and metallocene catalysts.

The copolymer (d3) is preferably a crystalline polymer. The copolymer (d3) may be a random copolymer, or may be a block copolymer. The copolymer that has high formability and provides a laminate having a strength withstanding the use is preferable, and the stereoregularity and molecular weight are not particularly limited in the range not impairing the advantageous effects of the invention.

A commercially available resin may also be used as it is.

The content of the structural unit derived from propylene in the trunk polymer is preferably 90 to 100 mol %, more preferably 95 to 100 mol %.

A content of the structural unit derived from propylene in the trunk polymer within this range can facilitate the obtaining of an adhesive layer having high heat resistance.

Examples of the unsaturated carboxylic acid and/or a derivative thereof include unsaturated compounds having one or more carboxylic acid groups, esters of unsaturated compounds having a carboxylic acid group with alkyl alcohols, and unsaturated compounds having one or more anhydrous carboxylic acid groups.

Examples of unsaturated groups include a vinyl group, a vinylene group, and unsaturated cyclic hydrocarbon groups.

The unsaturated carboxylic acid and/or a derivative thereof are suitably unsaturated dicarboxylic acids or acid anhydrides thereof, particularly preferably maleic acid, nadic acid, or acid anhydrides thereof.

These unsaturated carboxylic acids and/or derivatives thereof can be used singly or two or more thereof may be used.

The content of the structural units derived from the unsaturated carboxylic acid and a derivative thereof in the modified polyolefin (D) is preferably 0.01 to 5 parts by weight, more preferably 0.05 to 3.5 parts by weight relative to 100 parts by weight of the trunk polymer.

A content of the structural units derived from the unsaturated carboxylic acid and a derivative thereof within this range can facilitate the obtaining of an adhesive layer having a good balance between the formability and the adhesiveness.

The method of modifying the trunk polymer is not particularly limited. Preferred is graft polymerization using the trunk polymer and the unsaturated carboxylic acid and/or a derivative thereof.

The method of grafting the unsaturated carboxylic acid and/or a derivative thereof is not particularly limited. A conventionally known graft polymerization method such as a solution method or a melt kneading method can be used. Examples thereof include a method of melting the trunk polymer, and adding an unsaturated carboxylic acid and/or a derivative thereof thereto to perform a graft reaction, or a method of dissolving the trunk polymer in a solvent to prepare a solution, and adding an unsaturated carboxylic acid and/or a derivative thereof thereto to perform a graft reaction.

In the modified polyolefin (D), small amounts of the unsaturated carboxylic acid and/or a derivative thereof may be grafted, and then the structure derived from the unsaturated carboxylic acid and/or a derivative thereof may be further modified, for example, with diamine or carbodiimide.

The content of the modified polyolefin (D) in the polypropylene adhesive is preferably 0.1 to 15 parts by weight, more preferably 1 to 13 parts by weight, particularly preferably 2 to 12 parts by weight relative to 100 parts by weight of the total of the copolymers (A), (B), and (C).

A content of the modified polyolefin (D) within this range can facilitate the obtaining of an adhesive layer having high adhesiveness to the metal substrate layer.

[Other Components]

The adhesive may appropriately contain, for example, propylene homopolymers, copolymers other than the polymers (A) to (D), or styrene elastomers in the ranges not impairing the advantageous effects of the invention in order to, for example, adjust the rigidity. For example, to adjust the formability, low density polyethylene (LDPE) and/or linear low density polyethylene (LLDPE) may be appropriately contained.

Besides, known additives such as tackifiers, antioxidants, ultraviolet absorbing agents, neutralizers, nucleating agents, light stabilizers, antistatic agents, anti-blocking agents, lubricants, tackifiers, odor adsorbents, antibacterial agents, pigments, inorganic and/or organic fillers, and a variety of synthetic resins may be contained as necessary.

A so-called tackifier is preferably compounded with the adhesive, particularly, to impart the tackiness. Examples of the tackifier can include rosin derivatives, terpene resin, petroleum resin, and hydrides thereof. Among these, preferred are hydrogenated terpene resin and hydrogenated petroleum resin.

The compounding amount of the tackifier is preferably 2 to 30% by weight relative to 100% by weight of the adhesive.

[Polypropylene Adhesive]

Examples of the methods of preparing the adhesive include methods of mixing the copolymers (A) to (C), and the modified polyolefin (D) and the other components as needed by a variety of known methods such as a Henschel mixer, a V blender, a ribbon blender, or a tumbler blender; and a method of melt kneading the copolymers (A) to (C), and the modified polyolefin (D) and the other components as needed by a single screw extruder, a twin screw extruder, a kneader, or a Banbury mixer. The mixture prepared by the mixing or the melt kneaded product prepared by the melt kneading may be granulated or pulverized as needed.

The MFR according to ASTM D 1238 (temperature: 230° C., load: 2.16 kg) of the adhesive is not particularly limited. The MFR is preferably 0.1 to 100 g/10 min, more preferably 0.1 to 30 g/10 min because such an adhesive provides an adhesive layer (I) having high formability.

The density of the adhesive measured according to JIS K7112 is preferably 0.85 to 0.91 g/cm$^3$, more preferably 0.86 to 0.90 g/cm$^3$.

<Laminate for Battery>

The present laminate is not particularly limited as long as it includes the polypropylene adhesive layer (I) and the metal substrate layer (II), and may include other layers according to desired applications.

In the present laminate, the adhesive layer (I) is preferably in contact with the metal substrate layer (II) to further demonstrate the advantageous effects of the invention.

The polypropylene adhesive layer (I) is a layer prepared using the polypropylene adhesive, preferably a layer composed of the polypropylene adhesive.

The present laminate is used in batteries. The batteries are preferably solar batteries, lithium ion batteries, and fuel batteries.

Examples of specific applications of the present laminate include sealing materials for solar batteries (sealing material between glass and a cell), fixing materials for aluminum frames of solar batteries, binders for fixing active materials of dye-sensitized solar cells, bonding layers of dye-sensitized solar cells for fixing a transparent electrode to an active material, packaging materials for lithium ion batteries (bonding layers between aluminum and sealant PP), tab lead materials (bonding layers between aluminum or copper and sealant PP), bonding layers between separators of fuel battery cells (such as titanium and stainless steel), and bonding layers between separators and a variety of gaskets of fuel battery cells.

The thickness of the present laminate is not particularly limited and may be appropriately selected according to a desired application. The thickness is preferably 5 μm to 100 mm, more preferably 10 μm to 50 mm.

The adhesive force (180° peel method, tensile tester, 23° C., crosshead speed: 200 mm/min) between the adhesive layer (I) and the metal substrate layer (II) in the present laminate is preferably 50 to 500 N/20 mm, more preferably 100 to 300 N/20 mm.

It can be said that a laminate having the adhesive force within this range is a laminate having high adhesiveness under normal temperature.

The adhesive force (180° peel method, tensile tester, 110° C., crosshead speed: 200 mm/min) between the adhesive layer (I) and the metal substrate layer (II) in the present laminate is preferably 50 to 500 N/20 mm, more preferably 60 to 300 N/20 mm.

It can be said that a laminate having the adhesive force within this range is a laminate having high adhesiveness under high temperature atmosphere.

The present laminate can be prepared by melting the polypropylene adhesive, and laminating the melted polypropylene adhesive on the metal substrate layer (II). Alternatively, the laminate can be prepared by a method of applying the melted polypropylene adhesive onto a surface of the metal substrate layer (II) made of, for example, a metal film, a metal plate, or a metal tube, or by a method of forming an adhesive layer preliminary formed, for example, into a film or sheet from the polypropylene adhesive, and melting the adhesive layer in the state where the adhesive layer is in contact with the metal substrate layer (II). Examples of a method for supplying thermal energy needed for melting of the adhesive layer in this step include known methods such as heat presses, burners, high frequency heating, and laser heating.

The thickness of the polypropylene adhesive layer (I) is not particularly limited and may be appropriately selected according to a desired application. The thickness is preferably 3 to 500 µm, more preferably 10 to 400 µm to facilitate the obtaining of a laminate for a battery having sufficient adhesiveness.

[Metal Substrate Layer (II)]

The metal substrate layer (II) contains at least one element selected from the group consisting of gold, copper, iron, chromium, zinc, cobalt, aluminum, titanium, tin, indium, magnesium, molybdenum, manganese, and silicon.

Examples of the metal substrate layer (II) include metal plates and metal foils made of one element selected therefrom, and plates and foils made of alloys containing two or more elements selected therefrom.

Preferable Examples of the element include aluminum, iron, stainless steel, and titanium.

The thickness of the metal substrate layer (II) is not particularly limited and may be appropriately selected according to a desired application. The thickness is preferably 2 µm to 100 mm, more preferably 5 µm to 50 mm.

[Other Layers]

Examples of the other layers include inorganic substance layers, thermoplastic resin layers, and gas barrier layers.

As the inorganic substance layer, a layer coating the surface of metal substrate layer (II) is preferable.

The inorganic substance layer is not particularly limited as long as it does not impart the advantageous effects of the invention. Examples thereof include layers made of inorganic compounds, such as oxides, nitrides, nitrogen oxides, sulfides, phosphides, phosphorus oxides, phosphorus nitrides, and phosphorus nitrogen oxides containing one or more metal elements listed as the constitutional elements of the metal substrate layer (II).

Preferable Examples of the metal element include aluminum, iron, stainless steel, and titanium.

Examples of the thermoplastic resin layer include layers made of a variety of thermoplastic resins excluding the barrier layer, such as layers made of polyolefin, polyester, polycarbonate, polyacryl, or polyurethane. Examples thereof specifically include layers made of polypropylene not graft modified, layers made of thermoplastic propylene elastomers, and layers made of polyester resins.

The layer made of the polyester resins may be a layer having printing properties, easy adhesiveness, and deposition properties by adjusting the composition of raw materials for forming the layer.

Examples of the polyester resin specifically include resins prepared through polycondensation of dicarboxylic acids (such as isophthalic acid, phthalic acid, terephthalic acid, 2,6-naphthalene dicarboxylic acid, adipic acid, and sebacic acid) or oxycarboxylic acids (such as p-oxybenzoic acid) with aliphatic glycols (such as ethylene glycol, propylene glycol, butane diol, diethylene glycol, 1,4-cyclohexanedimethanol, and neopentyl glycol).

These dicarboxylic acids, oxycarboxylic acids, and aliphatic glycols each may be used alone or two or more thereof may be used.

Representative examples of the polyester resin include PET, polyethylene-2,6-naphthalene dicarboxylate (PEN), and polybutylene terephthalate (PBT). The resin may be a copolymer comprising a homopolymer and 30 mol % or less of a third component.

The gas barrier layer is not particularly limited and examples thereof include barrier resin layers containing resins having high barrier properties, such as a variety of known resins having gas barrier properties, such as saponified products of ethylene-vinyl acetate copolymers (EVOH), polyamide resins (PA), polyvinylidene chloride resins, and polyacrylonitriles.

Preferable examples of the EVOHs include polymers prepared through saponification of ethylene-vinyl acetate copolymers (ethylene content: 15 to 70 mol %) and having a degree of saponification of 90 to 100%.

Examples of the PAs include nylon 6, nylon 66, nylon 610, nylon 12, nylon 11, MXD nylon, amorphous nylon, and copolymerized nylons.

The configuration of present laminate can have any including the other layers is not particularly limited. Examples thereof include laminates such as substrate layer (II)/adhesive layer (I)/barrier layer; substrate layer (II)/adhesive layer (I)/barrier layer/adhesive layer (I)/substrate layer (II); and substrate layer (II)/adhesive layer (I)/barrier layer/adhesive layer (I)/thermoplastic resin layer.

EXAMPLES

Hereinafter, the present invention will be more specifically described by way of Examples and Comparative Examples, but these Examples are not limitative to the present invention within the scope thereof.

[MFR]

The MFR was measured according to ASTM D 1238 at 230° C. under a load of 2.16 kg.

[Density]

The density was measured according to JIS K7112.

[Melting Point (Tm)]

The Tm of the copolymer used as raw materials for an adhesive listed below was measured by differential scanning calorimetry according to the following method.

A sample (about 5 mg) was filled into a dedicated aluminum pan. Using DSC Pyris1 or DSC7 made by PerkinElmer Inc., the sample was heated from 30° C. to 200° C. at 320° C./min, and was kept at 200° C. for 5 minutes. The sample was then cooled from 200° C. to 30° C. at 10° C./min, and was kept at 30° C. for another 5 minutes, followed by heating at 10° C./min. From the endothermic curve in this heating at 10° C./min, the melting point was determined.

If several peaks were detected during the measurement, the peak temperature detected at the highest temperature was defined as the melting point (Tm).

[Polymer Composition]

The contents of the structural unit derived from propylene, the structural unit derived from ethylene, and the structural unit derived from α-olefin in the copolymer used as a raw material for the adhesive below were measured by $^{13}$C-NMR under the following condition using the following apparatus.

The contents of the structural units derived from propylene, ethylene, and α-olefin were determined using a JECX 400P nuclear magnetic resonance apparatus made by JEOL, Ltd. under the following condition: A deuterated orthodichlorobenzene/hexadeuterobenzene (80/20 vol %) mixed solvent was used as a solvent, the sample concentration was 60 mg/0.6 mL, the temperature for measurement was 120° C., the observation nuclear was $^{13}$C (100 MHz), the sequence was single-pulse proton decoupling, the pulse width was 4.62 microseconds (45° pulse), the repetition time was 5.5 seconds, the number of integrations was 8000 times, and a reference value of chemical shift was 29.73 ppm.

[Ethylene Content Z]

Based on the expression, using the amount of the copolymer (A) used in the adhesive and the content of the structural unit derived from ethylene in the copolymer (A) measured in [Polymer composition], the total proportion of the structural unit derived from ethylene (ethylene content Z) relative to 100 mol % of the total structural units forming the copolymer (A) contained in the adhesive was calculated.

[Amount of Structural Unit Derived from Unsaturated Carboxylic Acid And Derivative Thereof]

The amount (graft amount) of the structural units derived from the unsaturated carboxylic acid and a derivative thereof was determined as follows: The intensity of the peak (1790 cm$^{-1}$ if maleic anhydride was used) derived from the structural unit was measured with an infrared absorption analyzer, and the amount of the structural units was determined using the calibration curve preliminarily created.

[Weight Average Molecular Weight (Mw) and Molecular Weight Distribution (Mw/Mn)]

The Mw and Mw/Mn of the copolymer used as the raw material for the following adhesive were measured using columns connected in series (two TSKgel GMH6-HT columns and two TSKgel GMH6-HTL columns all made by Tosoh Corporation and having a column size, i.e., a diameter of 7.5 mm and a length of 300 mm) with a liquid chromatography (made by TA Instruments-Waters LLC, Alliance/GPC2000). The medium of the mobile phase used was o-dichlorobenzene containing 0.025% by weight of an antioxidant (butylhydroxytoluene, made by Takeda Pharmaceutical Company Limited), and the measurement was performed under a condition at a sample concentration of 0.15% (V/W), a flow rate of 1.0 mL/min, and a temperature of 140° C. In the case where the copolymer has a molecular weight of 500 to 20,600,000, standard polystyrenes made by Tosoh Corporation were used here.

The obtained chromatogram was analyzed by a known method using data processing software Empower 2 made by TA Instruments-Waters LLC to calculate the number average molecular weight (Mn), the Mw, and the Mw/Mn using the calibration curve created from the standard polystyrene samples.

(Polyolefins Used)

The polyolefins used in Examples and Comparative Examples are listed below. These polyolefins all were prepared through polymerization according to a normal method, unless otherwise specified.

[Propylene Copolymer (A)]
PP: random polypropylene
    (MFR=7.0 g/10 min, density=0.90 g/cm$^3$, ethylene content=3 mol %, propylene content=96 mol %, butene content=1 mol %, melting point=140° C.)

PBER: ethylene-propylene-α-olefin copolymer
    (MFR=7.0 g/10 min, density=0.87 g/cm$^3$, ethylene content=13 mol %, propylene content=68 mol %, butene content=19 mol %, melting point=140° C., Mw/Mn=2.1)

[Butene-Containing Copolymer (B)]
PBR-1: propylene-butene random copolymer
    (MFR=7.0 g/10 min, density=0.88 g/cm$^3$, propylene content=74 mol %, butene content=26 mol %, melting point=75° C., Mw/Mn=2.1)
PBR-2: propylene-butene random copolymer
    (MFR=7.0 g/10 min, density=0.89 g/cm$^3$, propylene content=85 mol %, butene content=15 mol %, melting point=98° C., Mw/Mn=2.2)

[Ethylene-α-Olefin Copolymer (C)]
EPR: ethylene-α-olefin copolymer
    (MFR=8.0 g/10 min, density=0.87 g/cm$^3$, ethylene content=80 mol %, propylene content=20 mol %, Mw/Mn=2.1)
EBR: ethylene-α-olefin copolymer
    (MFR=8.0 g/10 min, density=0.87 g/cm$^3$, ethylene content=85 mol %, butene content=15 mol %, Mw/Mn=2.1)

[Modified Polyolefin (D)]
Modified PP: modified isotactic homopolypropylene
    (MFR=100 g/10 min, density=0.90 g/cm$^3$, graft amount of maleic anhydride=3.0 wt %)

Example 1

<Preparation of Propylene Adhesive>

PP (45% by weight), PBER (20% by weight), PBR-1 (10% by weight), EPR (20% by weight), and modified PP (5% by weight) were melt kneaded using a single screw extruder at 230° C. to yield a propylene adhesive. The resulting propylene adhesive had an MFR of 8.2 g/10 min and a density of 0.89 g/cm$^3$.

<Preparation of Laminate for Battery and Adhesive Force>

Using an extrusion molding machine provided with a T die, the adhesive prepared in Example 1 was molded into a film having a thickness of 50 μm. The resulting film was sandwiched between two aluminum foils having a thickness of 300 μm, and was heat sealed with a heat sealer at 160° C. and 0.1 MPa for 5 seconds. The resulting multi-layer film was cut into a width of 20 mm, and the adhesive force (unit: N/20 mm) between the aluminum foils and the adhesive layer was measured using a tensile tester by 180° peel method at room temperature (23° C.) or 110° C. The crosshead speed was 200 mm/min. The result is shown in Table 1.

Examples 2 to 4, Comparative Examples 1 to 3

Adhesives were prepared by the same method as in Example 1 except that propylene adhesives were prepared according to the compounding formula shown in Table 1. Laminates were prepared using the resulting adhesives, and the adhesive forces were measured. The results are shown in Table 1.

TABLE 1

|  |  | Example 1 | Example 2 | Example 3 | Example 4 | Comparative Example 1 | Comparative Example 2 | Comparative Example 3 |
|---|---|---|---|---|---|---|---|---|
| PP | wt % | 45 | 45 | 35 | 45 | 75 | 65 | 55 |
| PBER | wt % | 20 | 20 | 20 | 20 |  |  | 20 |
| PBR-1 | wt % | 10 |  | 20 | 10 |  | 10 |  |
| PBR-2 | wt % |  | 10 |  |  |  |  |  |

TABLE 1-continued

|  |  | Example 1 | Example 2 | Example 3 | Example 4 | Comparative Example 1 | Comparative Example 2 | Comparative Example 3 |
|---|---|---|---|---|---|---|---|---|
| EPR | wt % | 20 | 20 | 20 |  | 20 | 20 | 20 |
| EBR | wt % |  |  |  | 20 |  |  |  |
| Modified PP | wt % | 5 | 5 | 5 | 5 | 5 | 5 | 5 |
| Ethylene content Z | mol % | 6.1 | 6.1 | 6.6 | 6.1 | 3.0 | 3.0 | 5.7 |
| MFR | g/10 min | 8.2 | 8.2 | 8.2 | 8.2 | 8.2 | 8.2 | 8.2 |
| Density | g/cm³ | 0.89 | 0.89 | 0.88 | 0.89 | 0.89 | 0.89 | 0.89 |
| Adhesive force (23° C.) | N/20 mm | 120 | 130 | 140 | 170 | 80 | 90 | 100 |
| Adhesive force (110° C.) | N/20 mm | 120 | 110 | 100 | 120 | 30 | 40 | 40 |

The invention claimed is:

1. A laminate for a battery, comprising a polypropylene adhesive layer (I) and a metal substrate layer (II),
    wherein the polypropylene adhesive layer (I) satisfies at least requirements (1) to (4):
    (1) the adhesive comprises a propylene copolymer (A), a butene-containing copolymer (B), and an ethylene-propylene copolymer (C), and the adhesive comprises 40 to 94% by weight of the copolymer (A); 3 to 30% by weight of the copolymer (B); and 3 to 30% by weight of the copolymer (C) relative to 100% by weight of the total thereof;
    (2) the copolymer (A) is a polymer having a melting point of 130° C. or more measured with a differential scanning calorimeter, and a total proportion of a structural unit derived from ethylene is 4 to 25 mol % relative to 100 mol % of a total structural units forming all the copolymers (A) contained in the adhesive;
    (3) the copolymer (B) includes less than 1 mol % of a structural unit derived from ethylene, and has a melting point of 100° C. or less measured with a differential scanning calorimeter; and
    (4) the copolymer (C) includes 50 to 99 mol % of a structural unit derived from ethylene.

2. The laminate for a battery according to claim 1, wherein relative to 100 parts by weight of a total of the copolymers (A), (B), and (C), the polypropylene adhesive further comprises 0.1 to 15 parts by weight of a modified polyolefin (D) modified with at least one selected from unsaturated carboxylic acids and derivatives thereof.

3. The laminate for a battery according to claim 2, wherein the modified polyolefin (D) includes 0.01 to 5 parts by weight of a structural unit derived from the unsaturated carboxylic acid and a derivative thereof relative to 100 parts by weight of structural units excluding a structural unit derived from the unsaturated carboxylic acid and a derivative thereof, and a content of a structural unit derived from propylene in the structural units excluding the structural unit derived from the unsaturated carboxylic acid and a derivative thereof of the modified polyolefin (D) is 90 to 100 mol %.

4. The laminate for a battery according to claim 1, wherein the copolymer (A) comprises 10% by weight or more of a propylene-ethylene-α-olefin copolymer relative to 100% by weight of the copolymer (A) contained in the adhesive, and the α-olefin has 4 or more carbon atoms.

5. The laminate for a battery according to claim 4, wherein the propylene-ethylene-α-olefin copolymer is a propylene-ethylene-1-butene copolymer.

6. The laminate for a battery according to claim 1, wherein the copolymer (A) is a propylene-α-olefin copolymer,
    the α-olefin has 2 or 4 to 20 carbon atoms, and
    the copolymer (A) includes 1 to 55 mol % of a structural unit derived from the α-olefin, and has a melt flow rate of 0.1 to 50 g/10 min measured according to ASTM D 1238 at a temperature of 230° C. under a load of 2.16 kg.

7. The laminate for a battery according to claim 1, wherein the copolymer (B) includes 10 to 30 mol % of a structural unit derived from butene and 90 to 70 mol % of a structural unit derived from propylene, and has a melt flow rate of 0.1 to 50 g/10 min measured according to ASTM D 1238 at a temperature of 230° C. under a load of 2.16 kg.

8. The laminate for a battery according to claim 1, wherein the copolymer (C) has a melt flow rate of 0.1 to 70 g/10 min measured according to ASTM D 1238 at a temperature of 230° C. under a load of 2.16 kg.

9. The laminate for a battery according to claim 1, wherein the battery is a solar battery.

10. The laminate for a battery according to claim 1, wherein the battery is a lithium ion battery.

11. The laminate for a battery according to claim 1, wherein the battery is a fuel battery.

12. The laminate for a battery according to claim 1, wherein the metal substrate layer (II) contains at least one element selected from the group consisting of gold, copper, iron, chromium, zinc, cobalt, aluminum, titanium, tin, indium, magnesium, molybdenum, manganese, and silicon.

* * * * *